United States Patent
Bernstein et al.

(10) Patent No.: US 7,402,854 B2
(45) Date of Patent: Jul. 22, 2008

(54) THREE-DIMENSIONAL CASCADED POWER DISTRIBUTION IN A SEMICONDUCTOR DEVICE

(75) Inventors: Kerry Bernstein, Underhill, VT (US); Paul W. Coteus, Yorktown, NY (US); Philip George Emma, Danbury, CT (US); Allan Mark Hartstein, Chappaqua, NY (US); Stephen V. Kosonocky, Wilton, CT (US); Ruchir Puri, Baldwin Place, NY (US); Mark B. Ritter, Sherman, CT (US)

(73) Assignee: International Business Machines Corporation, Armonk, NY (US)

( * ) Notice: Subject to any disclaimer, the term of this patent is extended or adjusted under 35 U.S.C. 154(b) by 171 days.

(21) Appl. No.: 11/496,120

(22) Filed: Jul. 31, 2006

(65) Prior Publication Data
US 2008/0023731 A1   Jan. 31, 2008

(51) Int. Cl.
*H01L 29/80* (2006.01)
(52) U.S. Cl. ............... 257/278; 257/777; 257/E27.026

(58) Field of Classification Search ................. 257/278, 257/E27.026
See application file for complete search history.

(56) References Cited

U.S. PATENT DOCUMENTS

| 5,440,249 | A | 8/1995 | Schucker et al. |
| 5,764,082 | A | 6/1998 | Taylor |
| 5,848,101 | A | 12/1998 | Taylor |
| 5,850,153 | A | 12/1998 | Harris et al. |
| 5,862,390 | A | 1/1999 | Ranjan |
| 6,320,228 | B1 | 11/2001 | Yu |
| 6,509,725 | B1 | 1/2003 | Bernstein et al. |
| 2003/0173673 | A1* | 9/2003 | Val ............................ 257/758 |
| 2005/0014311 | A1* | 1/2005 | Hayasaka et al. ............ 438/109 |
| 2006/0249812 | A1* | 11/2006 | Sakurabayashi et al. .... 257/532 |
| 2006/0256964 | A1* | 11/2006 | Gu et al. ...................... 380/242 |
| 2007/0297156 | A1* | 12/2007 | Hosomi ...................... 361/763 |

* cited by examiner

*Primary Examiner*—Tu-Tu V Ho
(74) *Attorney, Agent, or Firm*—Ido Tuchman; Ryan, Mason & Lewis, LLP

(57) ABSTRACT

An IC structure having reduced power loss and/or noise includes two or more active semiconductor regions stacked in a substantially vertical dimension, each active semiconductor region including an active layer. The IC structure further includes two or more voltage supply planes, each of the voltage supply planes corresponding to a respective one of the active layers.

1 Claim, 2 Drawing Sheets

THREE-DIMENSIONAL CASCADED POWER DISTRIBUTION IN A SEMICONDUCTOR DEVICE

FIELD OF THE INVENTION

The present invention relates generally to semiconductor devices, and more particularly relates to techniques for reducing power loss and/or noise in a semiconductor device.

BACKGROUND OF THE INVENTION

As the state of the art of integrated circuits (ICs) has advanced, designers have reduced the power supply voltage required to power the circuits. However, in order to provide a fixed amount of power to an IC device, as the supply voltage (V) is decreased, the current (I) consumed by the device must necessarily increase. The higher current flowing in the IC device generally results in an increased amount of power loss and/or noise in the device.

It is known that by increasing the voltage supplied to an IC device, a fixed amount of power may be delivered at substantially less current, thereby reducing power lost, for example, to IR heating and/or inductive noise (Ldi/dt) which is proportional to the current in the device. To reduce noise, an IC device may be separated into dedicated regions based, at least in part, on circuit functionality. For example, an IC may include an analog section comprising primarily analog circuitry (e.g., input/output buffers, bias generators, etc.) and a digital section comprising primarily digital circuitry (e.g., digital control circuits, digital signal processor, logic gates, etc.). These regions are generally isolated, to at least some extent, from one another so as to reduce the likelihood that noise generated by one region will be undesirably introduced into another region. However, essentially all current flowing in the IC device is eventually returned (e.g., via a substrate in the IC device) to a common ground, and therefore such a circuit arrangement typically does not noticeably reduce leakage current effects in the device.

It is also known to use separate conductive planes (e.g., metal layers) in an IC device for conveying multiple supply voltages in the device, with each supply voltage being assigned its own metal layer in the device. Capacitors and/or inductors are commonly used to stabilize the respective voltages on the planes and to decouple noise. However, these capacitors are often located too far from the circuit(s) sharing that supply plane. This results in the loss of power due, at least in part, to the distributed IR drop of the local leakages of many devices in a deep-submicron logic chip.

Accordingly, there exists a need for an improved IC architecture having reduced power loss and/or noise that does not suffer from one or more of the problems exhibited by conventional IC arrangements.

SUMMARY OF THE INVENTION

The present invention, in illustrative embodiments thereof, meets the above-noted need by providing an IC device which employs a physically-cascaded, as well as electrically-cascaded, voltage supply architecture adopted in a three-dimensional (3D) structure, with each voltage supply plane corresponding to its own active semiconductor layer in the IC device. With the IC device arranged in this manner, capacitors and/or inductors can be advantageously placed so as to take advantage of their proximity to the actual current sources. Significantly less capacitance is therefore needed to achieve substantially the same amount of supply voltage stabilization as in standard decoupling arrangements.

In accordance with one embodiment of the invention, an IC structure having reduced power loss and/or noise includes two or more active semiconductor regions stacked in a substantially vertical dimension, each active semiconductor region including an active layer. The IC structure further includes two or more voltage supply planes, each of the voltage supply planes corresponding to a respective one of the active layers. The IC structure may further include multiple capacitors, each of the capacitors being connected between a common ground plane in the IC structure and a respective one of the voltage supply planes.

These and other features, advantages and objects of the present invention will become apparent from the following detailed description of illustrative embodiments thereof, which is to be read in connection with the accompanying drawings.

DETAILED DESCRIPTION OF THE INVENTION

The present invention will be described herein in the context of illustrative embodiments of an IC device comprising a physically- and electrically-cascaded voltage supply architecture configured in a 3D structure, with each voltage supply plane corresponding to its own active semiconductor layer in the device. It should be understood, however, that the present invention is not limited to the particular IC architecture shown. Rather, the present invention provides techniques for advantageously reducing impedance in an IC device to thereby beneficially reduce noise and/or power loss due to, among other factors, IR heating, etc. The present invention thus provides an efficient power distribution architecture for an IC device.

It is to be understood that the various layers and/or regions shown in the accompanying figures may not be drawn to scale. Furthermore, one or more semiconductor layers of a type commonly used in such IC structures may not be explicitly shown in a given figure for ease of explanation. This does not imply that the semiconductor layers not explicitly shown are omitted in the actual IC device. Similarly, each of the layers shown in the figures may not be required and may therefore be omitted in the actual IC device, in accordance with embodiments of the invention.

Figure 1:
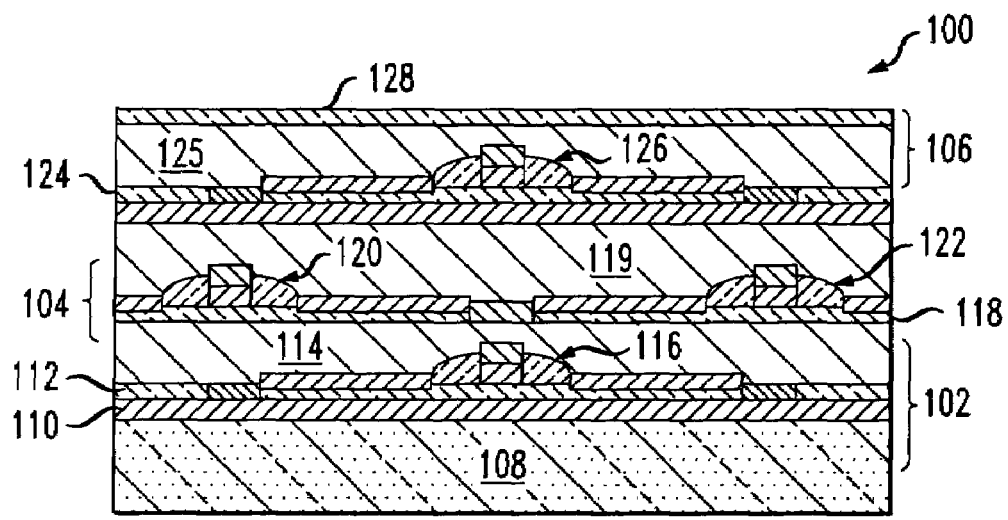
FIG. 1 is a cross-sectional view depicting at least a portion of an exemplary IC device in which techniques of the present invention can be implemented.

FIG. 1 is a cross-sectional view depicting at least a portion of an exemplary IC structure 100 in which techniques of the present invention can be implemented. The illustrative IC structure 100 includes three active regions, namely, a first active region 102, a second active region 104 formed on an upper surface of the first active region, and a third active region 106 formed on an upper surface of the second active region. The active regions are preferably stacked on top of one another in a substantially vertical dimension, as in a sandwich configuration. It is to be understood that the present invention is not limited to the specific number of active regions shown, and that a higher number of active regions (e.g., four) or a lower number of active regions (e.g., two) is similarly contemplated by the invention.

First active region 102 includes a support substrate 108, an insulating layer 110 formed on an upper surface of the substrate, an active layer 112 formed on an upper surface of insulating layer 110, and an insulating layer 114 formed on an upper surface of the active layer. The term "active layer" as used herein is intended to refer to one or more distinct semiconductor layers in which active devices (e.g., transistors, diodes, etc.) may be fabricated. An active layer may also include connection structures (e.g., metal conductors, input/output pads, etc.) for providing electrical connection to and/or between active devices formed therein. The substrate 108 is commonly formed of single-crystal silicon (e.g., having a <100> or <111> crystal orientation), although suitable alternative materials may also be used, such as, but not limited to, germanium (Ge), gallium arsenide (GaAs), etc. Additionally, the substrate may be formed of an insulating material (e.g., silicon dioxide).

Active layer 112 preferably comprises a relatively thin silicon epitaxial layer, typically about 6 to 10 micrometers, although the present invention is not limited to any particular thickness of the active layer. Active layer 112 is preferably doped with a p-type impurity (e.g., boron) or an n-type impurity (e.g., arsenic or phosphorous) of a prescribed concentration level (e.g., about $5 \times 10^{18}$ to about $5 \times 10^{19}$ atoms per cubic centimeter), such as by a diffusion or implant step, to change the conductivity of the active layer as desired. Active layer 112 may further include source and drain regions formed therein, proximate an upper surface of the active layer, such as by a conventional implant and diffusion process. The source and drain regions are preferably doped, such as by a conventional implant step, with an impurity of a known concentration level to selectively change the conductivity of the material as desired. Preferably, the source and drain regions have a conductivity type associated therewith which is opposite a conductivity type of active layer 112, so that active devices, such as, for example, transistor 116, can be formed therein.

Each of the second and third active regions 104 and 106, respectively, are preferably formed in a manner similar to the first active region 102. Specifically, second active region 104 includes an active layer 118, which is formed on and supported by insulating layer 114, and an insulating layer 119 formed on an upper surface of active layer 118. Source and drain regions may be formed in active layer 118, proximate an upper surface of active layer 118, such as by a conventional implant and diffusion process. Preferably, the source and drain regions in active layer 118 have a conductivity type associated therewith which is opposite a conductivity type of active layer 118, so that active devices, such as, for example, transistors 120 and 122, can be formed therein. Likewise, third active region 106 includes an active layer 124, which is formed on and supported by insulating layer 119, and an insulating layer 125 formed on an upper surface of active layer 124. Source and drain regions may be formed in active layer 124, proximate an upper surface of active layer 124, such as by a conventional implant and diffusion process. Preferably, the source and drain regions formed in active layer 124 have a conductivity type associated therewith which is opposite a conductivity type of active layer 124, so that active devices, such as, for example, transistor 126, can be formed therein.

Therefore, IC structure 100 includes multiple stacked active layers 112, 118 and 124, in which semiconductor elements, such as, for example, transistors 116, 120 and 126, are respectively formed. Each of the active layers is separated by corresponding insulating layers (e.g., 114 and 119) in the IC structure 100.

Figure 2:
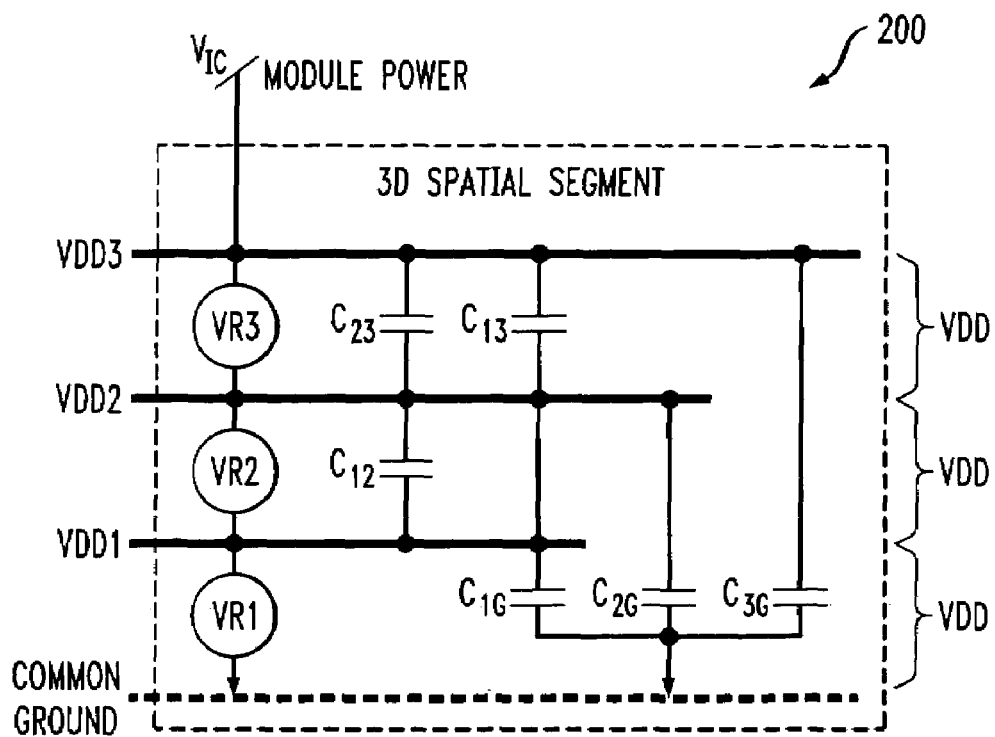
FIG. 2 is a schematic diagram depicting an exemplary IC structure configured so as to reduce noise and/or power loss, formed in accordance with an embodiment of the present invention.

FIG. 2 is a schematic diagram depicting an exemplary IC structure 200 configured so as to reduce noise and/or power loss, formed in accordance with an embodiment of the present invention. IC structure 200 includes a supply voltage architecture that is physically-cascaded as well as electrically-cascaded. Specifically, the overall voltage supply network in IC structure 200 is preferably segmented into a plurality of voltage supply planes, namely, VDD1, VDD2 and VDD3, and configured such that each voltage supply plane corresponds to its own separate active layer in the structure. As used herein, the term "voltage plane" is intended to refer to a network of electrical conductors (e.g., busses, wires, traces, etc.) associated with a given active layer for supplying voltage to one or more electrical components and/or circuits formed in the given active layer. By assigning separate voltage supply planes to their own dedicated physical domains in a 3D IC structure, improved noise immunity and capacitive decoupling, as well as other advantages, can be achieved.

IC structure 200 is preferably provided with a higher voltage, $V_{IC}$, which is substantially equal to a sum of the supply voltages required for each voltage plane (e.g., 3×VDD), plus a small margin for each plane. The voltage supplied to each voltage supply plane is preferably the same, such as VDD, although the invention contemplates that the voltages supplied to the respective voltage supply planes may be different. As previously stated, by increasing the voltage supplied to the IC structure, a fixed amount of power can be delivered at substantially less current, thereby reducing power lost, for example, to IR heating and/or inductive noise (Ldi/dt) which is proportional to the current in the structure. By providing the IC structure 200 with a higher voltage $V_{IC}$, this voltage can be stepped down into multiple operating supplies using, for example, simple resistor dividers, or alternative voltage generation circuitry.

Figure 3:
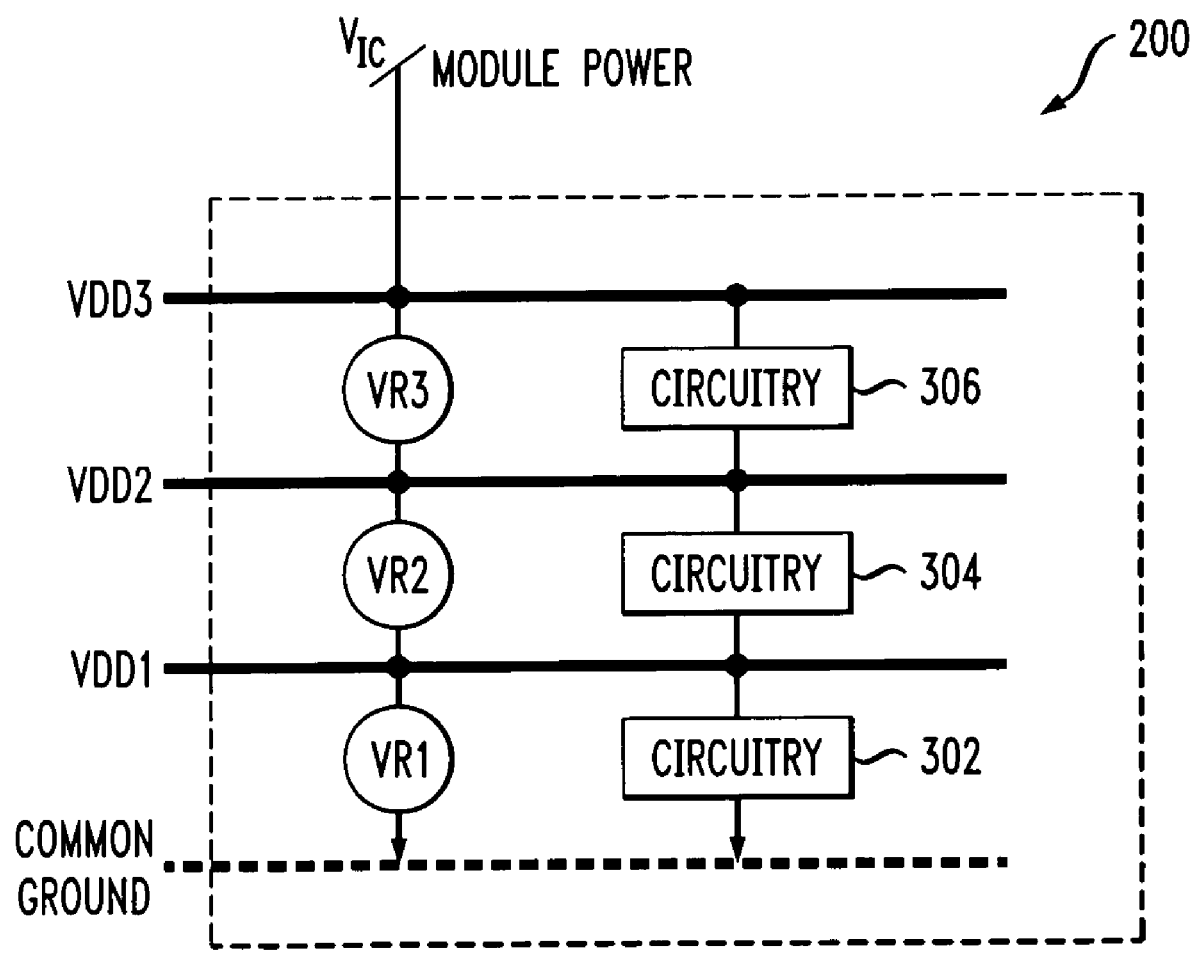
FIG. 3 is a schematic diagram depicting exemplary circuit connections in the illustrative IC structure shown in FIG. 2, in accordance with an aspect of the invention.

FIG. 3 is a schematic diagram depicting exemplary circuit connections in the illustrative IC structure 200 shown in FIG. 2, in accordance with an aspect of the invention. The IC structure 200 includes a common ground through which current in the device is returned. Circuitry 302 residing in the first active region is connected between voltage supply plane VDD1 and the common ground, as in standard IC devices having a single active layer. Circuitry 304 residing in the second active region is connected between voltage supply planes VDD2 and VDD1. In this instance, supply plane VDD1 serves as a virtual ground for circuitry 304. Likewise, circuitry 306 residing in the third active region is connected between voltage supply planes VDD3 and VDD2. In this instance, supply plane VDD2 serves as a virtual ground for circuitry 306.

In accordance with another aspect of the invention, the circuitry 302, 304, 306 comprises at least two timing circuits, each of the timing circuits residing in at least two respective active regions in the IC structure 200. The timing circuits are preferably configured such that a prescribed timing relationship is maintained between the at least two respective active regions.

Each voltage supply plane VDD1, VDD2 and VDD3 may include a voltage reference source VR1, VR2 and VR3, respectively, for regulating the voltage on a corresponding supply plane. Each voltage reference source is preferably connected between adjacent voltage supply planes. For example, voltage reference source VR3 is connected between supply planes VDD3 and VDD2, voltage reference source VR2 is connected between supply planes VDD2 and VDD1, and voltage reference source VR1 is connected between supply plane VDD1 and a common ground plane, which may be electrically connected to the substrate of the IC structure 200 (e.g., substrate 108 shown in FIG. 1).

With this 3D configuration of the voltage supply planes in the IC structure 200, current will flow vertically and be eventually collected by the common ground. Thus, leakage current in the third active layer, associated with voltage supply plane VDD3, will be added to voltage supply plane VDD2. Likewise, leakage current in the second active layer, associated with voltage supply plane VDD2, will be added to voltage supply plane VDD1, etc. In this manner, overall leakage current in the IC structure 200 will be advantageously reduced, thereby reducing power loss due to IR drops in the device.

With reference again to FIG. 2, in order to stabilize the voltage on each supply plane VDD1, VDD2, and VDD3 and to decouple noise on each supply plane, one or more capacitors and/or inductors are preferably employed in the illustrative IC structure 200. For example, IC structure 200 includes a first capacitor, $C_{1G}$, connected between supply plane VDD1 and ground, a second capacitor, $C_{2G}$, connected between supply plane VDD2 and ground, and a third capacitor, $C_{3G}$, connected between supply plane VDD3 and ground. Additional capacitors may be employed between the voltage supply planes themselves. For example, IC structure 200 may further include a fourth capacitor, $C_{12}$, coupled between supply planes VDD1 and VDD2, a fifth capacitor, $C_{13}$, coupled between supply planes VDD1 and VDD3, and a sixth capacitor, $C_{23}$, coupled between supply planes VDD2 and VDD3.

Each of the capacitors $C_{12}$, $C_{13}$, $C_{23}$, $C_{1G}$, $C_{2G}$, and C3G is preferably integrated onto the IC structure 200 rather than being a discrete off-chip capacitor, although use of off-chip capacitors is similarly contemplated by the invention, particular when large capacitance values are required. These capacitors should be formed having oxides thick enough to reduce the likelihood of direct tunneling, which could otherwise damage the capacitor, and should be located substantially centrally so as to minimize IR drops to the next active layer(s) down.

Because of the unique configuration of the voltage supply planes in IC structure 200, the decoupling capacitors can be beneficially placed so as to take advantage of their proximity to the actual current sources in the IC structure, thereby significantly reducing the amount of capacitance needed to achieve the same effective level of voltage stabilization. Furthermore, because capacitors can be placed closer to the circuits sharing a given voltage supply plane, compared to standard IC architectures, power loss attributable to distributed IR drops, as well as other current leakage factors, can be substantially reduced in the IC structure.

Process variability is an important consideration when two or more separate active regions must maintain a prescribed timing relationship. Two tolerance issues are the creation and distribution of the voltage reference, and the creation and distribution of a reference clock signal in the IC structure. Such reference clock signal may be supplied, for example, by one or more timing circuits residing either externally to the IC structure or located in one or more active layers of the IC structure. With regard to the voltage reference, control voltages servicing voltage reference sources VR1, VR2 and VR3 are ideally generated via a voltage divider, or alternative voltage generation circuitry, on one of the active layers and then supplied directly to their respective voltage reference sources. In this manner, a significant source of variation in the IC structure is mitigated. With regard to the reference clock signal, the more clock distribution and local regeneration that can be accomplished on the same active layer, the lower total skew and jitter will be. Consequently, much of a standard H-tree spine, or alternative clock distribution circuitry, used to locally distribute the reference clock throughout the IC structure ideally resides on a single active layer.

To minimize the amount of control and adjustment that is required of a regulator supplying power to the IC structure 200, it is preferred to balance the power consumption requirements associated with each of the active regions, so that average current dissipation through each active layer is substantially the same. This enables essentially effortless division of the overall IC supply voltage $V_{IC}$ and mitigation of excessive supply noise. One way to achieve this is via a "power rule" which allows the global chip designer to predetermine the current requirements of each active layer and the amount of decoupling capacitance needed. It is also desirable to balance respective footprints of the multiple active layers, so that the silicon area (e.g., square millimeters of silicon) of the circuitry in each of the active layers is substantially the same. This design objective is entirely consistent with the desire to balance the load currents in the active layers since, in order to achieve proper load balancing, the number of active devices in each of the active layers is preferably made substantially the same.

In accordance with another embodiment of the invention, the IC structure includes additional active regions (not shown), with the decoupling capacitors themselves residing in these dedicated additional active regions. In this manner, flexibility is provided to more precisely place and route the decoupling capacitors so as to further enhance 3D cascaded power distribution in the IC structure.

In order to implement certain design optimizations, an electronic design automation (EDA) infrastructure, or alternative design tool, is preferably employed to enable a chip designer to perform one or more of the following: balancing loads on voltage supplies from one active layer to another active layer to facilitate prescribed voltage differentials on each voltage supply plane; placing circuits to achieve uniform power consumption across each active region; achieving footprint balancing across active layers; creating a power supply image which effectively redistributes current to the next capacitor cascaded down; voltage shifting of signals shuttled from one supply plane to the next, which essentially involves translation of "virtual ground" to absolute ground; and inserting an appropriate amount of stiffening capacitance as needed so that, after correction, each voltage supply plane has approximately the same amount of capacitance. An effective resistance across each of the active layers is also preferably made substantially the same, giving rise to equal response independent of the active layer in which it resides.

One of the benefits of the IC structure formed in accordance with embodiments of the present invention is that supply noise specific to a particular circuit topology may be easily isolated to one active region and corresponding voltage supply plane. The stiffening capacitors act as noise isolators. In addition, circuits that are highly intolerant to noise can be collected and placed in one or more active regions which do not use noise-generating circuits, or at least have minimal noise generating circuitry therein.

By assigning separate voltage supply planes to their own dedicated active regions in an IC device, the device is able to achieve improved noise immunity and capacitive decoupling, reduced IR drop of leakage and distribution due, at least in part, to grid wire length distribution reduction, mitigation of "hot spot" and "brown-out" voltage supply regions due, at least in part, to point excessive power consumption, and less inductive response to clocked instantaneous power demand, among other benefits.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. An integrated circuit structure, comprising:

a plurality of active semiconductor regions stacked in a substantially vertical dimension, each active semiconductor region including an active layer;

a plurality of voltage supply planes, each of the voltage supply planes residing in a respective one of the active layers, each of a given one of the voltage supply planes including at least one capacitor connected between the given voltage supply plane and at least one of the other voltage supply planes, the voltage supply planes being configured such that for a given one of the active layers, a corresponding voltage supply plane serves as a virtual ground for another one of the active layers formed above and adjacent to the given active layer, the voltage supply planes being further configured such that leakage current associated with the given one of the active layers is added to current supplied to another of the active layers formed below and adjacent to the given active layer; and a plurality of circuits, each of the active semiconductor regions including at least one of the plurality of circuits, the plurality of circuits including at least two timing circuits residing in at least two respective active semiconductor regions, the timing circuits being configured such that a prescribed timing relationship is maintained between the at least two respective active semiconductor layers, at least one of the plurality of circuits including clock distribution circuitry for distributing a reference clock signal supplied to the integrated circuit structure throughout the integrated circuit structure, wherein each of the plurality of circuits is connected to a corresponding voltage supply plane in such a manner as to achieve substantially uniform power consumption across each of the plurality of active semiconductor regions;

wherein a voltage supplied to the integrated circuit structure is substantially equal to a sum of voltage requirements corresponding to the respective supply voltage planes, and wherein loads on voltage supplies from one active layer to another active layer are substantially balanced so as to facilitate prescribed voltage differentials on each of the voltage supply planes.

* * * * *